United States Patent
Chen et al.

(10) Patent No.: US 12,243,613 B2
(45) Date of Patent: Mar. 4, 2025

(54) VOLTAGE OUTPUT TEST CIRCUIT, VOLTAGE DIVIDER OUTPUT CIRCUIT, AND MEMORY

(71) Applicant: Changxin Memory Technologies, Inc., Anhui (CN)

(72) Inventors: Chan Chen, Hefei (CN); Anping Qiu, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 267 days.

(21) Appl. No.: 17/955,865

(22) Filed: Sep. 29, 2022

(65) Prior Publication Data

US 2023/0267967 A1   Aug. 24, 2023

Related U.S. Application Data

(63) Continuation of application No. PCT/CN2022/098103, filed on Jun. 10, 2022.

(30) Foreign Application Priority Data

Feb. 24, 2022 (CN) .......................... 202210173837.0

(51) Int. Cl.
G11C 5/14 (2006.01)
G01R 15/04 (2006.01)
G05F 1/614 (2006.01)

(52) U.S. Cl.
CPC .............. *G11C 5/147* (2013.01); *G01R 15/04* (2013.01); *G05F 1/614* (2013.01)

(58) Field of Classification Search
CPC .......... G11C 5/147; G01R 15/04; G05F 1/614
(Continued)

(56) References Cited

U.S. PATENT DOCUMENTS 7,531,994 B2    5/2009  Itoh
8,395,520 B2 *  3/2013  Xiong ...................... G06F 1/28
                                                    340/661
(Continued)

FOREIGN PATENT DOCUMENTS

CN    101013330 A    8/2007
CN    102721916 A    10/2012
(Continued)

OTHER PUBLICATIONS

PCT International Search Report and the Written Opinion mailed Nov. 17, 2022, issued in related International Application No. PCT/CN2022/098103, with English translation (20 pages).

*Primary Examiner* — Yemane Mehari
(74) *Attorney, Agent, or Firm* — Sheppard Mullin Richter & Hampton LLP (57) ABSTRACT

Embodiments of this invention provide a voltage output test circuit, a voltage divider output circuit, and a memory. The voltage output test circuit includes: a first voltage divider unit, including a first terminal and a second terminal, where the first terminal of the first voltage divider unit is connected to a test power supply, and the second terminal of the first voltage divider unit is connected to an output terminal; a second voltage divider unit, including a first terminal and a second terminal, where the first terminal of the second voltage divider unit is connected to a ground, and the second terminal of the second voltage divider unit is electrically connected to the output terminal; and a third voltage divider unit, configured to adjust a resistance between the output terminal and the ground.

18 Claims, 7 Drawing Sheets

(58) Field of Classification Search
USPC .......................................................... 323/281
See application file for complete search history.

(56) References Cited

U.S. PATENT DOCUMENTS

| | | | |
|---|---|---|---|
| 8,896,270 B2 | 11/2014 | Tanaka | |
| 9,136,018 B2* | 9/2015 | Lee | ................ G11C 5/147 |
| 9,568,523 B2* | 2/2017 | Herrmann | ............... G01R 27/02 |
| 2017/0254842 A1* | 9/2017 | Bahl | .................. G01R 31/2639 |
| 2019/0311773 A1* | 10/2019 | Jimenez-Olivares | ........................ G11C 5/147 |
| 2020/0076447 A1 | 3/2020 | Gowdhaman et al. | |
| 2021/0303266 A1* | 9/2021 | Myung | ............... G11C 11/1673 |

FOREIGN PATENT DOCUMENTS

| | | | |
|---|---|---|---|
| CN | 102969698 A | 3/2013 | |
| CN | 110687952 A | 1/2020 | |
| JP | 2001-325792 A | 11/2001 | |
| JP | 2008-287845 A | 11/2008 | |

\* cited by examiner

VOLTAGE OUTPUT TEST CIRCUIT, VOLTAGE DIVIDER OUTPUT CIRCUIT, AND MEMORY

CROSS-REFERENCE TO RELATED APPLICATIONS

This application is a continuation application of International Patent Application No. PCT/CN2022/098103, filed on Jun. 10, 2022, which claims priority to Chinese Patent Application No. 202210173837.0, filed with the China National Intellectual Property Administration on Feb. 24, 2022 and entitled "VOLTAGE OUTPUT TEST CIRCUIT, VOLTAGE DIVIDER OUTPUT CIRCUIT, AND MEMORY." The above-referenced applications are incorporated herein by reference in their entirety.

TECHNICAL FIELD

This invention relates to the field of integrated circuits, and in particular, to a voltage output test circuit, a voltage divider output circuit, and a memory.

BACKGROUND

As a part of chip testing, voltage output signals may need to be compared with each other. In some dynamic random access memories (DRAMS), such as LPDDR4, a voltage signal is read out by an On-Die-Termination (ODT) pad. The ODT pad allows a user to control an on or off state of an internal terminal resistor by using a read/write MR register. The objective is to control signals at the terminal resistor to prevent these signals from being reflected by the circuit, and improve the integrity of the signals. In some DRAMs, such as LPDDR5, there may not be any ODT pads, and a voltage signal needs to be read out by a DQ pad. The DQ pad is configured to input and output data and can perform bidirectional data transmission. However, the voltage read out by the DQ pad can be inaccurate, affecting the reliability of chip test.

SUMMARY

Embodiments of this invention provide a voltage output test circuit, a voltage divider output circuit, and a memory, to improve the accuracy of a read-out voltage of an output terminal.

An embodiment of the present invention provides a voltage output test circuit, including: a first voltage divider unit, including a first terminal and a second terminal, where the first terminal of the first voltage divider unit is electrically connected to a test power supply, and the second terminal of the first voltage divider unit is electrically connected to an output terminal; a second voltage divider unit, including a first terminal and a second terminal, where the first terminal of the second voltage divider unit is connected to a ground, and the second terminal of the second voltage divider unit is electrically connected to the output terminal; and a third voltage divider unit, configured to adjust a resistance between the output terminal and the ground.

In an embodiment, the third voltage divider unit and the second voltage divider unit are connected in parallel.

In an embodiment, the third voltage divider unit is a variable resistor.

In an embodiment, the variable resistor includes a plurality of resistors connected in parallel, and a resistance of the variable resistor is changed by changing a quantity of resistors connected in parallel.

In an embodiment, the third voltage divider unit includes a first terminal and a second terminal, the first terminal of the third voltage divider unit is connected to the ground, the second terminal of the third voltage divider unit is electrically connected to the output terminal, a resistance threshold of the third voltage divider unit is less than a resistance of the second voltage divider unit, and the second voltage divider unit and the third voltage divider unit can be electrically connected to the same output terminal.

In an embodiment, the second voltage divider unit and the third voltage divider unit are separately electrically connected to the output terminal through a switch unit.

In an embodiment, the third voltage divider unit includes at least two voltage divider sub-units, each voltage divider sub-unit is connected to the output terminal and the ground, resistances of the at least two voltage divider sub-units are different, and one of the at least two voltage divider sub-units can be electrically connected to the output terminal.

In an embodiment, the first voltage divider unit is a variable resistor; and by changing a resistance of the first voltage divider unit, a ratio of the resistance of the first voltage divider unit to the resistance between the output terminal and the ground can be equal to a predetermined value.

In an embodiment, the voltage output test circuit includes: a first branch, including the first voltage divider unit and the second voltage divider unit; and a second branch, including the third voltage divider unit and a fourth voltage divider unit, where the third voltage divider unit includes a first terminal and a second terminal, the first terminal of the third voltage divider unit is connected to the ground, the second terminal of the third voltage divider unit is electrically connected to the output terminal, the fourth voltage divider unit includes a first terminal and a second terminal, the first terminal of the fourth voltage divider unit is electrically connected to the test power supply, the second terminal of the fourth voltage divider unit is electrically connected to the output terminal, and a resistance of the third voltage divider unit is less than a resistance of the second voltage divider unit, where either the first branch or the second branch can be electrically connected to the test power supply and a voltage output terminal.

In an embodiment, a ratio of a resistance of the first voltage divider unit to a resistance of the fourth voltage divider unit is equal to a ratio of the resistance of the second voltage divider unit to the resistance of the third voltage divider unit.

In an embodiment, the voltage output test circuit includes a plurality of second branches, where resistances of third voltage divider units of the different second branches are different and are all less than the resistance of the second voltage divider unit, and one of the first branch and the plurality of second branches can be electrically connected to the test power supply and the voltage output terminal.

In an embodiment, the voltage output test circuit further includes a feedback unit, where the feedback unit is separately electrically connected to the first branch, the second branch, and a voltage output terminal, and is configured to selectively drive, based on a value of a leakage current or a voltage of the output terminal, the first branch or the second branch to electrically connect to the test power supply and the voltage output terminal.

In an embodiment, the first voltage divider unit and the fourth voltage divider unit are separately connected to the test power supply through a switch unit, the first branch and the second branch are separately connected to the output terminal through a switch unit, the output test circuit further includes a logic gate circuit, and the logic gate circuit is configured to provide a control signal of the switch unit.

In an embodiment, the voltage output test circuit is configured to test a memory.

In an embodiment, the memory comprises an LPDDR5.

An embodiment of this invention further provides a voltage divider output circuit, including at least one voltage output test circuit described above, where the at least one voltage output test circuit is connected to a voltage output terminal through a connection circuit, and one of the at least one voltage output test circuit can be electrically connected to the voltage output terminal.

In an embodiment, the connection circuit includes: a first connection branch, including a first terminal and a second terminal, where the first terminal of the first connection branch is electrically connected to an output terminal of the voltage output test circuit, and the second terminal of the first connection branch is electrically connected to the voltage output terminal; and a second connection branch, which is connected in parallel to the first connection branch, the second connection branch including a feedback amplifier, where either the first connection branch or the second connection branch can be electrically connected to the voltage output test circuit and the voltage output terminal.

An embodiment of this invention further provides a memory, including the voltage output test circuit described above.

According to the voltage output test circuit provided in the embodiments of this invention, the third voltage divider unit adjusts a drive current of the voltage output test circuit by adjusting the resistance between the output terminal and the ground, to reduce impact caused by a leakage current between the output terminal and the ground to the read-out voltage of the output terminal, so that the read-out voltage of the output terminal remains in a tolerable error range, improving the accuracy of the read-out voltage of the output terminal, and improving the reliability of a chip test.

DESCRIPTION OF EMBODIMENTS

Specific implementations of a voltage output test circuit, a voltage divider output circuit, and a memory provided in the embodiments of this invention are descried in detail below with reference to the accompanying drawings.

Figure 1:
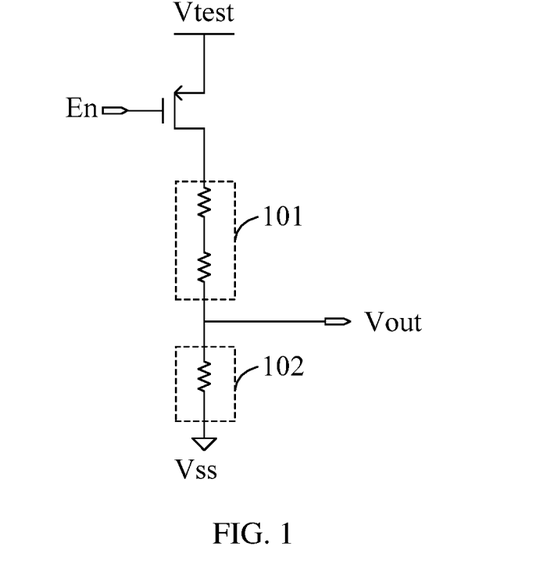
FIG. 1 is a circuit diagram of a voltage output test circuit according to some embodiments of this invention.

FIG. 1 is a circuit diagram of a voltage output test circuit according to some embodiments of this invention. As shown in FIG. 1, the voltage output test circuit includes a first voltage divider unit 101 and a second voltage divider unit 102. The first voltage divider unit 101 includes a first terminal and a second terminal, the first terminal of the first voltage divider unit 101 is electrically connected to a test power supply Vtest, and the second terminal of the first voltage divider unit 101 is electrically connected to an output terminal Vout. The second voltage divider unit 102 includes a first terminal and a second terminal, the first terminal of the second voltage divider unit 102 is connected to a ground Vss, and the second terminal of the second voltage divider unit 102 is electrically connected to the output terminal Vout. The output terminal Vout is configured to output a read-out voltage.

The output voltage read out by using the voltage output test circuit can be inaccurate. The reason for this problem can be that the output terminal is a DQ pad. In a data transmission process, a drive circuit needs to be added to the output terminal. To adapt to the design of SRAMs such as LPDDR5, a leakage current range allowed by the DQ pad is larger, for example, +/−5 µA. When the last-stage drive circuit has a relatively large leakage current during data transmission, that is, a leakage current between the output terminal Vout and the ground Vss is relatively large, a voltage drop on the second voltage divider unit 102 is relatively large, so that a voltage of the output terminal Vout increases. Consequently, a read-out voltage of the output terminal Vout is inaccurate.

In view of this, this embodiment of this invention provides a voltage output test circuit.

The voltage output test circuit includes a first voltage divider unit, a second voltage divider unit, and a third voltage divider unit. The first voltage divider unit includes a first terminal and a second terminal, the first terminal of the first voltage divider unit is electrically connected to a test power supply, and the second terminal of the first voltage divider unit is electrically connected to an output terminal. The second voltage divider unit includes a first terminal and a second terminal, the first terminal of the second voltage divider unit is connected to a ground, and the second terminal of the second voltage divider unit is electrically connected to the output terminal. The third voltage divider unit is configured to adjust a resistance between the output terminal and the ground.

The third voltage divider unit adjusts a drive current of the voltage output test circuit by adjusting the resistance between the output terminal and the ground, to reduce impact caused by a leakage current between the output terminal and the ground to the read-out voltage of the output terminal, so that the read-out voltage of the output terminal remains in a tolerable error range, improving the accuracy of the read-out voltage of the output terminal Vout, and improving the reliability of a chip test.

For example, when the leakage current between the output terminal and the ground is relatively large, the read-out voltage of the output terminal increases. In this case, the third voltage divider unit reduces the resistance between the output terminal and the ground to increase the drive current of the voltage output test circuit and reduce the read-out voltage of the output terminal, so that the read-out voltage of the output terminal remains in the tolerable error range. When the leakage current between the output terminal and the ground decreases, if the drive current of the voltage output test circuit remains unchanged, the read-out voltage of the output terminal decreases. In this case, the third voltage divider unit increases the resistance between the output terminal and the ground to reduce the drive current of the voltage output test circuit and increase the read-out voltage of the output terminal, so that the read-out voltage of the output terminal remains in the tolerable error range.

In addition, the voltage drop, between the output terminal and the ground, caused by the leakage current between the output terminal and the ground also changes with the resistance between the output terminal and the ground. If the resistance between the output terminal and the ground decreases, the voltage drop, between the output terminal and the ground, caused by the leakage current between the output terminal and the ground also decreases, thereby reducing impact caused by the leakage current to the read-out voltage of the output terminal. As a result, the read-out voltage of the output terminal Vout remains in the tolerable error range, and the accuracy of the read-out voltage is improved.

Figure 2:
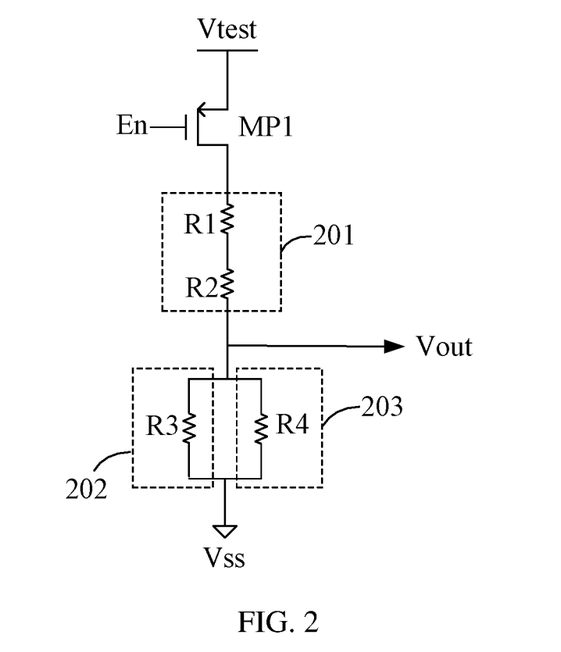
FIG. 2 is another circuit diagram of a voltage output test circuit according to some embodiments of this invention.

FIG. 2 is another circuit diagram of a voltage output test circuit according to some embodiments of this invention. As shown in FIG. 2, the voltage output test circuit includes a first voltage divider unit 201, a second voltage divider unit 202, and a third voltage divider unit 203.

The first voltage divider unit 201 includes a first terminal and a second terminal, where the first terminal of the first voltage divider unit 201 is electrically connected to a test power supply Vtest, and the second terminal of the first voltage divider unit 201 is electrically connected to an output terminal Vout. The first voltage divider unit 201 is a resistor unit, which may include a plurality of sub-resistors connected in series, a plurality of sub-resistors connected in parallel, or some sub-resistors connected in series and some sub-resistors connected in parallel. For example, in this embodiment, the first voltage divider unit 201 includes two sub-resistors R1 and R2 that are connected in series. One terminal of the sub-resistor R1 is used as the first terminal of the first voltage divider unit 201, and is electrically connected to the test power supply Vtest. The other terminal of the sub-resistor R1 is electrically connected to one terminal of the sub-resistor R2. The other terminal of the sub-resistor R2 is used as the second terminal of the first voltage divider unit 201, and is electrically connected to the output terminal Vout. The output terminal Vout is configured to output a read-out voltage. In some embodiments, resistances of the sub-resistor R1 and the sub-resistor R2 are the same. In some other embodiments, the resistances of the sub-resistor R1 and the sub-resistor R2 may alternatively be different.

In this embodiment, the first voltage divider unit 201 is connected to the test power supply Vtest through a switch unit. The switch unit includes a PMOS transistor MP1. When the voltage output test circuit needs to work, a signal En is enabled to control the PMOS transistor to get connected, so that the first voltage divider unit 201 is electrically connected to the test power supply Vtest. When the voltage output test circuit does not need to work, the signal En is enabled to control the PMOS transistor to get disconnected, so that the first voltage divider unit 201 is disconnected from the test power supply Vtest.

The second voltage divider unit 202 includes a first terminal and a second terminal, where the first terminal of the second voltage divider unit 202 is connected to a ground Vss, and the second terminal of the second voltage divider unit 202 is electrically connected to the output terminal Vout. In this embodiment, the second voltage divider unit 202 is a resistor unit, which may include a plurality of sub-resistors connected in series, a plurality of sub-resistors connected in parallel, or some sub-resistors connected in series and some sub-resistors connected in parallel. For example, in this embodiment, the second voltage divider unit 202 includes one sub-resistor R3. One terminal of the sub-resistor R3 is used as the second terminal of the second voltage divider unit 202, and is electrically connected to the output terminal Vout. The other terminal of the sub-resistor R3 is used as the first terminal of the second voltage divider unit 202, and is configured to connect to the ground Vss. In some embodiments, a resistance of the sub-resistor R3 is the same as the resistance of the sub-resistor R1 and the resistance of the sub-resistor R2. In some other embodiments, the resistance of the sub-resistor R3 may alternatively be different from the resistance of the sub-resistor R1 and the resistance of the sub-resistor R2, or may be the same as the resistance of either the sub-resistor R1 or the sub-resistor R2.

The third voltage divider unit 203 is configured to adjust a resistance between the output terminal Vout and the ground Vss. The third voltage divider unit 230 is connected in parallel between the output terminal Vout and the ground Vss. In this embodiment, the third voltage divider unit 203 and the second voltage divider unit 202 are connected in parallel, so that a resistance between the output terminal Vout and the ground Vss can be reduced, and a drive current of the voltage output test circuit is increased, and impact caused by a leakage current between the output terminal Vout and the ground Vss to a read-out voltage of the output terminal Vout is reduced.

In some embodiments, the third voltage divider unit 203 is a fixed resistor R4, which can reduce the resistance between the output terminal Vout and the ground Vss to a predetermined value. One terminal of the fixed resistor R4 is used as a second terminal of the third voltage divider unit 203, and is electrically connected to the output terminal Vout. The other terminal of the resistor fixed R4 is used as a first terminal of the third voltage divider unit 203, and is configured to connect to the ground Vss. A resistance of the resistor fixed R4 may be set based on a value of a leakage current, so that a read-out voltage of the output terminal Vout remains in a tolerable error range. In some embodiments, resistances of the resistor fixed R4 and the sub-resistor R3 are the same. In some other embodiments, the resistance of the fixed resistor R4 may alternatively be greater than or equal to the resistance of the sub-resistor R3.

Figure 3:
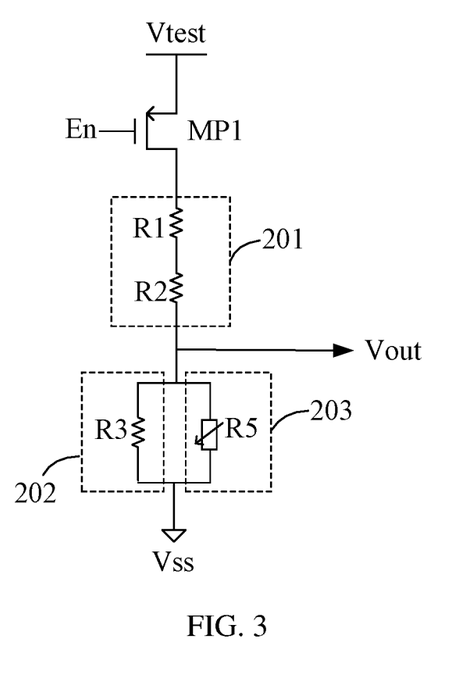
FIG. 3 is yet another circuit diagram of a voltage output test circuit according to some embodiments of this invention.

In another embodiment of this invention, the third voltage divider unit 203 is a variable resistor, which can change the resistance between the output terminal Vout and the ground Vss based on the value of the leakage current, so that the read-out voltage of the output terminal Vout remains in the tolerable error range. For example, refer to FIG. 3, which is a circuit diagram of a voltage output test circuit according to some embodiments of this invention. The difference between FIG. 3 and FIG. 2 is that the third voltage divider unit 203 is a variable resistor R5. When the leakage current between the output terminal Vout and the ground Vss increases, the resistance of the third voltage divider unit 203 is reduced; and when the leakage current between the output terminal Vout and the ground Vss decreases, the resistance between the third voltage divider unit 203 is increased, so that the read-out voltage of the output terminal Vout remains in the tolerable error range. In some embodiments, the variable resistor includes a plurality of resistors connected in parallel, and a resistance of the variable resistor is changed by changing a quantity of resistors connected in parallel.

In some embodiments, the third voltage divider unit 203 and the second voltage divider unit 202 are connected in parallel, and work together to adjust the resistance between the output terminal Vout and the ground Vss. In another embodiment of this invention, either the second voltage divider unit 202 or the third voltage divider unit 203 may be electrically connected to the output terminal Vout to adjust the resistance between the output terminal and the ground.

Figure 4:
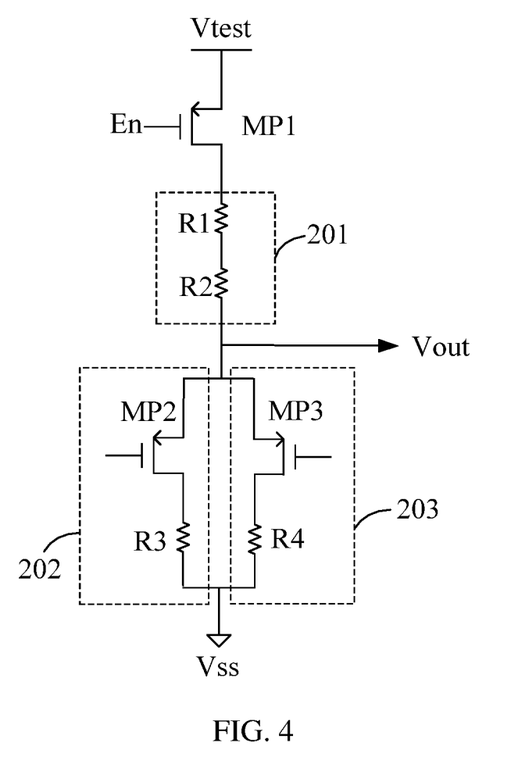
FIG. 4 is yet another circuit diagram of a voltage output test circuit according to some embodiments of this invention.

For example, refer to FIG. 4, which is yet another circuit diagram of a voltage output test circuit according to some embodiments of this invention. The difference between FIG. 4 and FIG. 2 is that either the second voltage divider unit 202 or the third voltage divider unit 203 can be electrically connected to the output terminal Vout. Specifically, the third voltage divider unit 203 is connected in parallel between the output terminal Vout and the ground Vss. Either the second voltage divider unit 202 or the third voltage divider unit 203 can be electrically connect to the output terminal Vout based on the value of the leakage current, so that the read-out voltage of the output terminal Vout remains in the tolerable error range.

The third voltage divider unit 203 includes a first terminal and a second terminal, where the first terminal of the third voltage divider unit 203 is configured to connect to the ground Vss, and the second terminal of the third voltage divider unit 203 is electrically connected to the output terminal Vout. A resistance threshold of the third voltage divider unit 203 is less than a resistance of the second voltage divider unit 202. When the leakage current between the output terminal Vout and the ground Vss increases, the third voltage divider unit 203 is electrically connected to the output terminal Vout; and when the leakage current between the output terminal Vout and the ground Vss decreases, the second voltage divider unit 202 is electrically connected to the output terminal Vout, so that the read-out voltage of the output terminal Vout remains in the tolerable error range.

In some embodiments, the second voltage divider unit 202 and the third voltage divider unit 203 are separately electrically connected to the output terminal Vout through a switch unit. The switch unit may be a transistor. For example, the second voltage divider unit 202 is electrically connected to the output terminal Vout through a PMOS transistor MP2, and the third voltage divider unit 203 is electrically connected to the output terminal Vout through a PMOS transistor MP3. When the leakage current between the output terminal Vout and the ground Vss increases, the PMOS transistor MP2 is disconnected to cut off the electrical connection between the second voltage divider unit 202 and the output terminal Vout, and the PMOS transistor MP3 is connected to implement the electrical connection between the third voltage divider unit 203 and the output terminal Vout; and when the leakage current between the output terminal Vout and the ground Vss decreases, the PMOS transistor MP2 is connected to implement the electrical connection between the second voltage divider unit 202 and the output terminal Vout, and the PMOS transistor MP3 is disconnected to cut off the electrical connection between the third voltage divider unit 203 and the output terminal Vout, so that the read-out voltage of the output terminal Vout remains in the tolerable error range.

In some embodiments, the third voltage divider unit 203 includes one unit, in other words, the third voltage divider unit 203 is electrically connected to the output terminal Vout as a whole. However, in another embodiment of this invention, the third voltage divider unit 203 includes at least two voltage divider sub-units, each voltage divider sub-unit is connected to the output terminal Vout and the ground Vss, resistances of the at least two voltage divider sub-units are different, and one of the at least two voltage divider sub-units can be electrically connected to the output terminal Vout.

Figure 5:
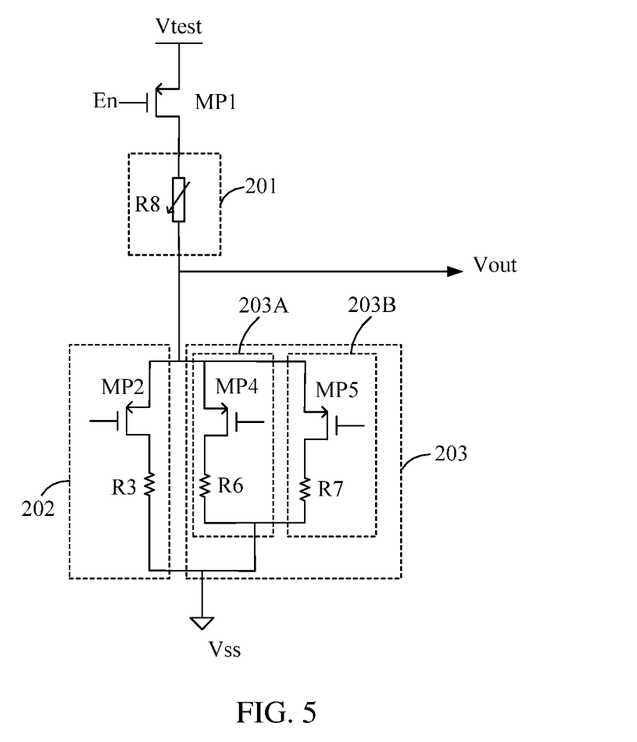
FIG. 5 is yet another circuit diagram of a voltage output test circuit according to some embodiments of this invention.

For example, refer to FIG. 5, which is yet another circuit diagram of a voltage output test circuit according to some embodiments of this invention. The third voltage divider unit 203 includes two voltage divider sub-units, which are a first voltage divider sub-unit 203A and a second voltage divider sub-unit 203B. The first voltage divider sub-unit 203A and the second voltage divider sub-unit 203B are connected in parallel, and are connected to the output terminal Vout and the ground Vss. Either the first voltage divider sub-unit 203A or the second voltage divider sub-unit 203B can be electrically connected to the output terminal Vout.

Resistances of the first voltage divider sub-unit 203A and the second voltage divider sub-unit 203B are different. For example, in this embodiment, the resistance of the first voltage divider sub-unit 203A is less than the resistance of the second voltage divider sub-unit 203B, and the resistances of both the first voltage divider sub-unit 203A and the second voltage divider sub-unit 203B are less than the resistance of the second voltage divider unit 202. In some embodiments, the resistance of the second voltage divider unit 202, the resistance of the second voltage divider sub-unit 203B, and the resistance of the first voltage divider sub-unit 203A may be reduced in equal proportions. For example, the second voltage divider unit 202 includes a sub-resistor R3, and a resistance thereof is R; the second voltage divider sub-unit 203B includes a sub-resistor R6, and a resistance thereof is R/2; and the first voltage divider sub-unit 203A includes a sub-resistor R7, and a resistance thereof is R/4, to effectively reduce the impact caused by the leakage current on the read-out voltage of the output terminal Vout.

In some embodiments, the first voltage divider sub-unit 203A and the second voltage divider sub-unit 203B are separately electrically connected to the output terminal Vout through a switch unit, so that either the first voltage divider sub-unit 203A or the second voltage divider sub-unit 203B is electrically connected to the output terminal Vout.

In another embodiment of this invention, the third voltage divider unit 203 may further include three or more voltage divider sub-units. A principle thereof is the same as that of FIG. 5, and details are not described herein again.

In some embodiments of this invention, the first voltage divider unit 201 is a variable resistor; and by changing a resistance of the first voltage divider unit 201, a ratio of the resistance of the first voltage divider unit 201 to the resistance between the output terminal Vout and the ground Vss can be equal to a predetermined value. Specifically, when the resistance between the output terminal Vout and the ground Vss decreases, the resistance of the first voltage divider unit 201 is reduced, so that the ratio of the resistance of the first voltage divider unit 201 to the resistance between the output terminal Vout and the ground Vss is equal to the predetermined value; and when the resistance between the output terminal Vout and the ground Vss increases, the resistance of the first voltage divider unit 201 is increased, so that the ratio of the resistance of the first voltage divider unit 201 to the resistance between the output terminal Vout and the ground Vss is equal to the predetermined value. Therefore, when a drive current increases, it is further ensured that the read-out voltage of the output terminal Vout remains in the tolerable error range, improving the stability of the read-out voltage.

For example, still refer to FIG. 5, the first voltage divider unit 201 is a variable resistor R8. In this case, when the output terminal Vout is connected to the ground Vss through the second voltage divider unit 202, the first voltage divider unit 201 is a first resistance; when the output terminal Vout is connected to the ground Vss through the second voltage divider sub-unit 203B, the first voltage divider unit 201 is a second resistance; and when the output terminal Vout is connected to the ground Vss through the first voltage divider sub-unit 203A, the first voltage divider unit 201 is a third resistance. The first resistance is greater than the second resistance, and the second resistance is greater than the third resistance.

Figure 6:
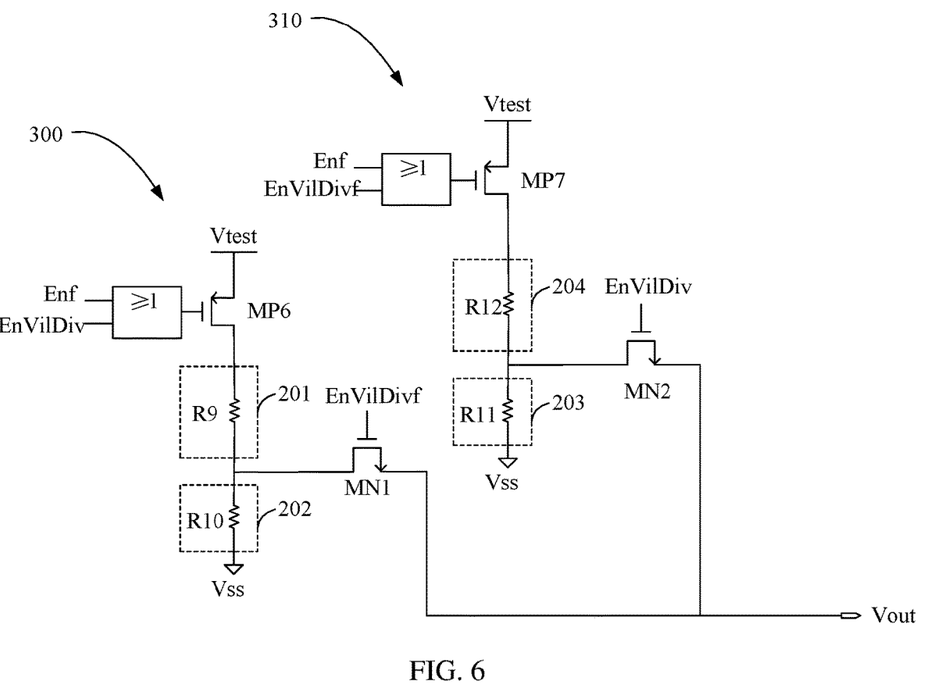
FIG. 6 is yet another circuit diagram of a voltage output test circuit according to some embodiments of this invention.

Some embodiments of this invention further provides a voltage output test circuit. FIG. 6 is yet another circuit diagram of the voltage output test circuit according to some embodiments of this invention. The voltage output test circuit includes a first branch 300 and a second branch 310.

The first branch 300 includes a first voltage divider unit 201 and a second voltage divider unit 202.

The first voltage divider unit 201 includes a first terminal and a second terminal, where the first terminal of the first voltage divider unit 201 is electrically connected to a test power supply Vtest, and the second terminal of the first voltage divider unit 201 is electrically connected to an output terminal Vout. The first voltage divider unit 201 is a resistor unit, which may include a plurality of sub-resistors connected in series, a plurality of sub-resistors connected in parallel, or some sub-resistors connected in series and some sub-resistors connected in parallel. In this embodiment, an example in which the first voltage divider unit 201 includes only one sub-resistor R9 is used for description.

The second voltage divider unit 202 includes a first terminal and a second terminal, where the first terminal of the second voltage divider unit 202 is connected to a ground Vss, and the second terminal of the second voltage divider unit 202 is electrically connected to the output terminal Vout. In this embodiment, the second voltage divider unit 202 is a resistor unit, which may include a plurality of sub-resistors connected in series, a plurality of sub-resistors connected in parallel, or some sub-resistors connected in series and some sub-resistors connected in parallel. In this embodiment, an example in which the second voltage divider unit 202 includes only one sub-resistor R10 is used for description.

The second branch 310 includes a third voltage divider unit 203 and a fourth voltage divider unit 204.

The third voltage divider unit 203 includes a first terminal and a second terminal, the first terminal of the third voltage divider unit 203 is connected to the ground Vss, and the second terminal of the third voltage divider unit 203 is electrically connected to the output terminal Vout. In this embodiment, the third voltage divider unit 203 is a resistor unit, which may include a plurality of sub-resistors connected in series, a plurality of sub-resistors connected in parallel, or some sub-resistors connected in series and some sub-resistors connected in parallel. In this embodiment, an example in which the third voltage divider unit 203 includes only one sub-resistor R11 is used for description. A resistance of the third voltage divider unit 203 is less than a resistance of the second voltage divider unit 202. For example, a resistance of the sub-resistor R11 is less than a resistance of the sub-resistor R10.

The fourth voltage divider unit 204 includes a first terminal and a second terminal, where the first terminal of the fourth voltage divider unit 204 is electrically connected to a test power supply Vtest, and the second terminal of the fourth voltage divider unit 204 is electrically connected to an output terminal Vout. The fourth voltage divider unit 204 is a resistor unit, which may include a plurality of sub-resistors connected in series, a plurality of sub-resistors connected in parallel, or some sub-resistors connected in series and some sub-resistors connected in parallel. In this embodiment, an example in which the fourth voltage divider unit 204 includes only one sub-resistor R12 is used for description.

In some embodiments, either the first branch 300 or the second branch 310 can be electrically connected to the test power supply Vtest and the voltage output terminal Vout based on a value of a leakage current between the output terminal Vout and the ground Vss. For example, when the leakage current between the output terminal Vout and the ground Vss increases, the second branch 310 is electrically connected to the test power supply Vtest and the voltage output terminal Vout. The resistance of the third voltage divider unit 203 of the second branch 310 is less than the resistance of the second voltage divider unit 202 of the first branch 300. Therefore, when the second branch 310 is electrically connected to the test power supply Vtest and the voltage output terminal Vout, the resistance between the output terminal Vout and the ground Vss is reduced, so that a read-out voltage of the output terminal Vout remains in a tolerable error range. When the leakage current between the output terminal Vout and the ground Vss decreases, the first branch is electrically connected to the test power supply Vtest and the voltage output terminal Vout, and the resistance between the output terminal Vout and the ground Vss is increased, so that the read-out voltage of the output terminal Vout remains in the tolerable error range.

In this embodiment, a ratio of the resistance of the first voltage divider unit 201 to the resistance of the fourth voltage divider unit 204 is equal to a ratio of the resistance of the second voltage divider unit 202 to a resistance of the third voltage divider unit 204, that is, a ratio of the resistance of the sub-resistor R9 to the resistance of the sub-resistor R10 is equal to a ratio of the resistance of the sub-resistor R12 to the resistance of the sub-resistor R11. Therefore, when the drive current increases, it is further ensured that the read-out voltage of the output terminal Vout remains in the tolerable error range, improving the stability of the read-out voltage.

In this embodiment, the first voltage divider unit 201 and the fourth voltage divider unit 204 are separately connected to the test power supply Vtest through a switch unit. The output test circuit further includes a logic gate circuit, and the logic gate circuit is configured to provide a control signal of the switch unit. The switch unit may be a transistor. In this embodiment, the logic gate circuit is used to reduce a quantity of control signals, reducing data bits occupied by the control signals, and avoiding greatly affecting a storage capacity of a memory.

Specifically, still refer to FIG. 6. The first voltage divider unit 201 is connected to the test power supply Vtest through a PMOS transistor MP6. The logic gate circuit is configured to provide a control signal of the PMOS transistor MP6. The logic gate circuit includes an OR gate circuit. The fourth voltage divider unit 204 is connected to the test power supply Vtest through a PMOS transistor MP7. The logic gate circuit is configured to provide a control signal of the PMOS transistor MP7. The logic gate circuit includes an OR gate circuit. By applying two complementary enable signals EnVilDiv and EnVilDivf, either the first branch 300 or the second branch 310 is electrically connected to the test power supply Vtest and the voltage output terminal Vout.

Still refer to FIG. 6. To reduce the power consumption, the first branch 300 and the second branch 310 are separately connected to the output terminal Vout through a switch unit. For example, the first branch 300 is connected to the output terminal Vout through an NMOS transistor MN1, and the second branch 310 is connected to the output terminal Vout through an NMOS transistor MN2. A control signal of the NMOS transistor MN1 may be the complementary signal EnVilDivf for the enable signal EnVilDiv. A control signal of the NMOS transistor MN2 may be may be the complementary signal EnVilDiv for the enable signal EnVilDivf.

Figure 7:
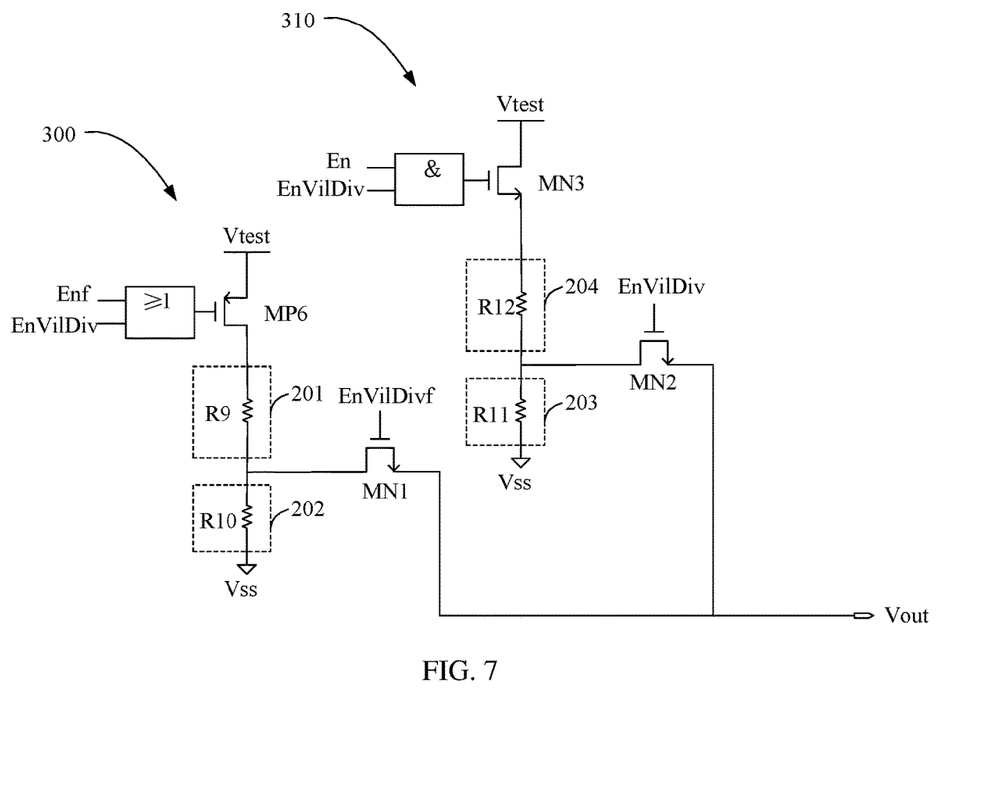
FIG. 7 is yet another circuit diagram of a voltage output test circuit according to some embodiments of this invention.

In some embodiments, the fourth voltage divider unit 204 is connected to the test power supply Vtest through a PMOS transistor MP7. However, in some embodiments of this invention, as shown in FIG. 7, the fourth voltage divider unit 204 is connected to the test power supply Vtest through an NMOS transistor MN3. A drive capability of an NMOS transistor is stronger than that of a PMOS transistor when they are of the same size. Therefore, a voltage drop lost on the NMOS transistor is smaller, further maintaining the stability of the read-out voltage of the output terminal Vout. It can be understood that the logic gate circuit configured to provide the control signal for the NMOS transistor MN3 is an OR gate circuit, and an enable signal thereof is the enable signal EnVilDiv. In this embodiment, the logic gate circuit is used to reduce a quantity of control signals, reducing data bits occupied by the control signals, and avoiding greatly affecting a storage capacity of a memory.

In some embodiments the voltage output test circuit includes one second branch. However, in another embodiment of this invention, the voltage output test circuit includes a plurality of second branches, where resistances of third voltage divider units of the different second branches are different and are all less than the resistance of the second voltage divider unit, and one of the first branch and the plurality of second branches can be electrically connected to the test power supply and the voltage output terminal.

Figure 8:
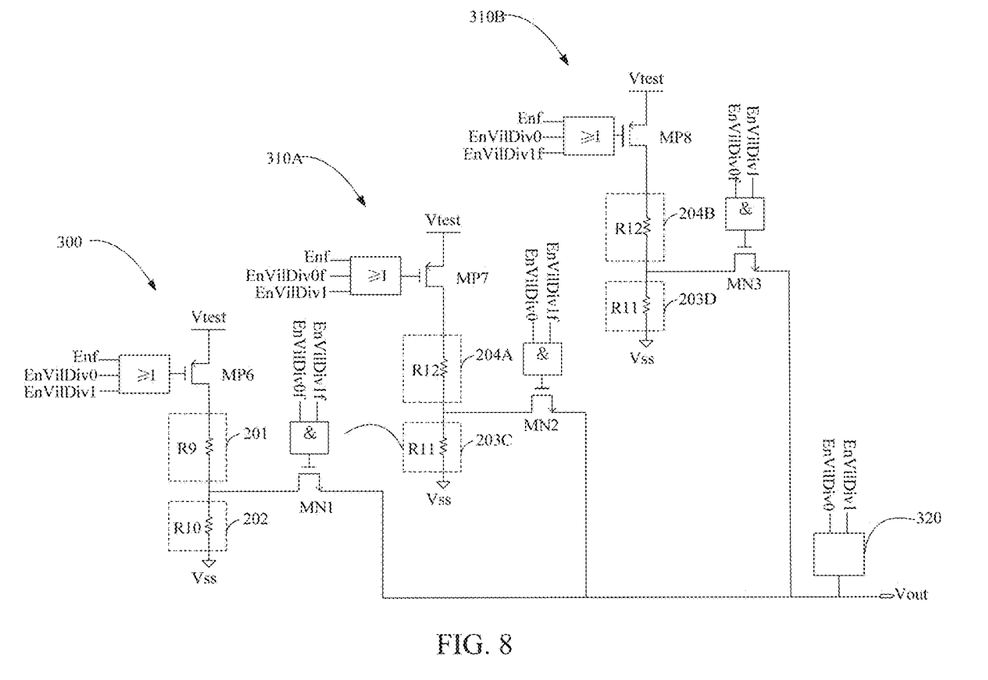
FIG. 8 is yet another circuit diagram of a voltage output test circuit according to some embodiments of this invention.

Specifically, refer to FIG. 8, which is yet another circuit diagram of a voltage output test circuit according to some embodiments of this invention. In this embodiment, the voltage output test circuit includes two second branches, which are a second branch 310A and a second branch 310B. Resistances of a third voltage divider unit 203C of the second branch 310A and a third voltage divider unit 203D of the second branch 310B are different, and are both less than a resistance of a second voltage divider unit 202. One of the first branch 300, the second branch 310A, and the second branch 310B can be electrically connected to the test power supply Vtest and the voltage output terminal Vout based on a leakage current between an output terminal Vout and a ground Vss.

In this embodiment, a ratio of a resistance of a fourth voltage divider unit 204A to a resistance of a third voltage divider unit 203C of the second branch 310A is equal to a ratio of a resistance to a resistance of a fourth voltage divider unit 204B to a third voltage divider unit 203D of the second branch 310B, to improve the stability of the read-out voltage of the output terminal Vout.

The first voltage divider unit 201 is connected to the test power supply Vtest through a PMOS transistor MP6. The logic gate circuit is configured to provide a control signal of the PMOS transistor MP6. The logic gate circuit includes an OR gate circuit. The fourth voltage divider unit 204A is connected to the test power supply Vtest through a PMOS transistor MP7. The logic gate circuit is configured to provide a control signal of the PMOS transistor MP7. The logic gate circuit includes an OR gate circuit. The fourth voltage divider unit 204B is connected to the test power supply Vtest through a PMOS transistor MP7. The logic gate circuit is configured to provide a control signal of the PMOS transistor MP8. The logic gate circuit includes an OR gate circuit.

By applying enable signals EnVilDiv and EnVilDivf, EnVilDiv1 and EnVilDiv1f enable one of the first branch 300, the second branch 310A, and the second branch 310B to electrically connect to the test power supply Vtest and the voltage output terminal Vout.

In some embodiments, to further reduce the power consumption, a control signal of an NMOS transistor MN2 is applied by the logic gate circuit to a control terminal of the NMOS transistor MN2, and a control signal of an NMOS transistor MN3 is applied by the logic gate circuit to a control terminal of the NMOS transistor MN3. Specifically, the control signal of the NMOS transistor MN2 and the control signal of the NMOS transistor MN3 are applied by an OR gate circuit to the control terminals of the NMOS transistor MN2 and the NMOS transistor MN3. Control signals of the OR gate circuit include an enable signal EnVilDiv, an enable signal EnVilDivf, an enable signal EnVilDiv1, and an enable signal EnVilDiv1f.

Still refer to FIG. 8. In this embodiment, the output test circuit further includes a feedback unit 320, where the feedback unit 320 is separately electrically connected to the first branch 300, the second branches, and a voltage output terminal Vout, and is configured to selectively drive, based on a value of a leakage current or a voltage of the output terminal Vout, the first branch 300 or the second branches to electrically connect to the test power supply and the voltage output terminal Vout. Specifically, in this embodiment, the feedback unit 320 is separately electrically connected to the first branch 300, the second branch 310A, the second branch 310B, and the voltage output terminal Vout. The feedback unit 320 can generate enable signals EnVilDiv0 and EnVilDiv1 based on the value of the leakage current or the voltage of the output terminal Vout, so that one of the first branch 300, the second branch 310A, and the second branch 310B is electrically connected to the test power supply and the voltage output terminal Vout.

According to the voltage output test circuit provided in the embodiments of this invention, the third voltage divider unit can adjust a drive current of the voltage output test circuit by adjusting the resistance between the output terminal and the ground, to reduce impact caused by a leakage current between the output terminal and the ground to the read-out voltage of the output terminal, so that the read-out voltage of the output terminal remains in a tolerable error range, improving the accuracy of the read-out voltage of the output terminal Vout, and improving the reliability of a chip test. The voltage output test circuit provided in the embodiments of this invention can be configured to test a memory, such as an LPDDR 5.

Figure 9:
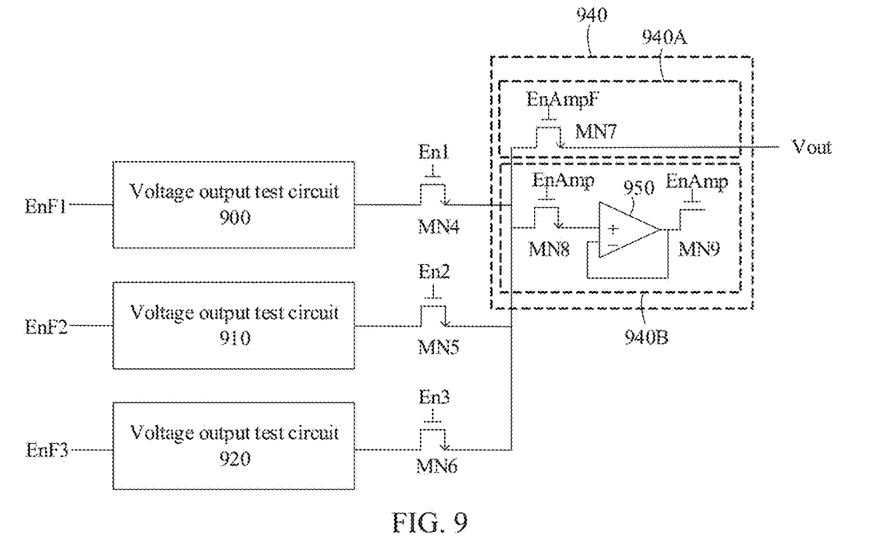
FIG. 9 is yet another circuit diagram of a voltage divider output circuit according to some embodiments of this invention.

An embodiment of this invention further provides a voltage divider output circuit using the foregoing voltage output test circuit. FIG. 9 is yet another schematic circuit diagram of a voltage divider output circuit according to some embodiments of this invention. The voltage divider output circuit includes a plurality of voltage output test circuits. In the figure, voltage output test circuits 900, 910, and 920 are illustrated as examples. Enable signals of the voltage output test circuits 900, 910, and 920 are respectively EnF1, EnF2, and EnF3. The enable signal merely represents that the voltage output test circuit corresponding to the enable signal has an enable signal, but does not limit the voltage output test circuit to having only one enable signal. One of the voltage output test circuits 902, 910, and 920 can be electrically connected to a voltage output terminal Vout. In this embodiment, one of the voltage output test circuits 902, 910, and 920 is electrically connected to the voltage output terminal Vout by controlling switch units by using the enable signals En1, En2, and EnF3. The switch units include an NMOS transistor MN4, an NMOS transistor MN5, and an NMOS transistor MN6.

All the voltage output test circuits are electrically connected to the voltage output terminal Vout through a connection circuit 940. In this embodiment, the connection circuit 940 includes a first connection branch 940A and a second connection branch 940B. Either the first connection branch 940A or the second connection branch 940B can be electrically connected to the voltage output test circuit and the voltage output terminal Vout.

The first connection branch 940A includes a first terminal and a second terminal, where the first terminal of the first connection branch 940A is electrically connected to an output terminal of the voltage output test circuit, and the second terminal of the first connection branch 940A is electrically connected to the voltage output terminal Vout. The first connection branch 940A includes an NMOS transistor NM7. One terminal of the NMOS transistor NM7 is electrically connected to the output terminal of the voltage output test circuit, and the other terminal of the NMOS transistor NM7 is electrically connected to the voltage output terminal Vout. An enable signal EnAmpF is used as a control signal of the NMOS transistor NM7, and controls connection and disconnection of the NMOS transistor MN7, to control whether the voltage output test circuit is electrically connected to the voltage output terminal Vout through the first connection branch.

The second connection branch 940B and the first connection branch 940A are connected in parallel. The second connection branch 940B includes one feedback amplifier 950 to reduce impact caused by a leakage current of the output terminal Vout to a read-out voltage. When a driving force of the feedback amplifier 950 is big enough, a value of the read-out voltage is not affected by the leakage current of the output terminal Vout.

In this embodiment, the second connection branch 940B includes a switch unit. The switch unit is an NMOS transistor MN8. The NMOS transistor MN8, disposed between the voltage output test circuit and the feedback amplifier 950, is used as a switch of the second connection branch 940B, and controls, by using an enable signal EnAmp, whether the voltage output test circuit is electrically connected to the voltage output terminal Vout through the second connection branch 940B.

In this embodiment, the second connection branch 940B further includes an NMOS transistor MN9. The NMOS transistor MN9 is disposed between the feedback amplifier 950 and the output terminal Vout, and controls, by using an enable signal EnAmp, whether the voltage output test circuit is electrically connected to the voltage output terminal Vout through the second connection branch 940B, to reduce the power consumption.

According to the voltage divider output circuit provided in this embodiment of this invention, the impact caused by the leakage current to the read-out voltage of the output terminal is reduced by using the voltage output test circuit, improving the accuracy of the read-out voltage. In addition, according to the voltage divider output circuit provided in this embodiment of this invention, the impact caused by the leakage current of the output terminal Vout to the read-out voltage is further reduced by using a gain function of a feedback amplifier.

An embodiment of this invention further provides a memory, including the voltage output test circuit described above. The memory may be a dynamic random access memory satisfying the LPDDR5 standard. The memory can provide an accurate read-out voltage, improving the chip test accuracy.

The foregoing descriptions are merely preferable implementations of this invention. It should be noted that a person of ordinary skill in the art may further make several improvements and modifications without departing from the principle of this invention, and these improvements and modifications shall also be considered as falling within the protection scope of this invention.

What is claimed is:

1. A voltage output test circuit, comprising:
a first voltage divider unit, comprising a first terminal and a second terminal, wherein the first terminal of the first voltage divider unit is connected to a test power supply, and the second terminal of the first voltage divider unit is connected to an output terminal;
a second voltage divider unit, comprising a first terminal and a second terminal, wherein the first terminal of the second voltage divider unit is connected to a ground, and the second terminal of the second voltage divider unit is connected to the output terminal; and
a third voltage divider unit, configured to adjust a resistance between the output terminal and the ground, wherein the third voltage divider unit comprises a first terminal and a second terminal, the first terminal of the third voltage divider unit is connected to the ground, the second terminal of the third voltage divider unit is connected to the output terminal, a resistance of the third voltage divider unit is less than a resistance of the second voltage divider unit, and either the second voltage divider unit or the third voltage divider unit is connected to the output terminal.

2. The voltage output test circuit according to claim 1, wherein the third voltage divider unit and the second voltage divider unit are connected in parallel.

3. The voltage output test circuit according to claim 2, wherein the third voltage divider unit is a variable resistor.

4. The voltage output test circuit according to claim 3, wherein the variable resistor comprises a plurality of resistors connected in parallel, and a resistance of the variable resistor is changed by changing a quantity of resistors connected in parallel.

5. The voltage output test circuit according to claim 1, wherein the second voltage divider unit and the third voltage divider unit are separately connected to the output terminal through a switch unit.

6. The voltage output test circuit according to claim 1, wherein the third voltage divider unit comprises at least two voltage divider sub-units, each voltage divider sub-unit is connected to the output terminal and the ground, resistances of the at least two voltage divider sub-units are different, and one of the at least two voltage divider sub-units is connected to the output terminal.

7. The voltage output test circuit according to claim 1, wherein the first voltage divider unit is a variable resistor;

and by changing a resistance of the first voltage divider unit, a ratio of the resistance of the first voltage divider unit to the resistance between the output terminal and the ground is equal to a predetermined value.

8. The voltage output test circuit according to claim 1, wherein the voltage output test circuit is configured to test a memory.

9. The voltage output test circuit according to claim 8, wherein the memory comprises an LPDDR5.

10. A voltage output test circuit, comprising:
a first voltage divider unit, comprising a first terminal and a second terminal, wherein the first terminal of the first voltage divider unit is connected to a test power supply, and the second terminal of the first voltage divider unit is connected to an output terminal;
a second voltage divider unit, comprising a first terminal and a second terminal, wherein the first terminal of the second voltage divider unit is connected to a ground, and the second terminal of the second voltage divider unit is connected to the output terminal; and
a third voltage divider unit, configured to adjust a resistance between the output terminal and the ground,
a first branch, comprising the first voltage divider unit and the second voltage divider unit; and
a second branch, comprising the third voltage divider unit and a fourth voltage divider unit, wherein the third voltage divider unit comprises a first terminal and a second terminal, the first terminal of the third voltage divider unit is connected to the ground, the second terminal of the third voltage divider unit is connected to the output terminal, the fourth voltage divider unit includes a first terminal and a second terminal, the first terminal of the fourth voltage divider unit is connected to the test power supply, the second terminal of the fourth voltage divider unit is connected to the output terminal, and a resistance of the third voltage divider unit is less than a resistance of the second voltage divider unit, wherein:
either the first branch or the second branch is connected to the test power supply and a voltage output terminal.

11. The voltage output test circuit according to claim 10, wherein a ratio of a resistance of the first voltage divider unit to a resistance of the fourth voltage divider unit is equal to a ratio of the resistance of the second voltage divider unit to the resistance of the third voltage divider unit.

12. The voltage output test circuit according to claim 10, comprising a plurality of second branches, wherein resistances of third voltage divider units of the different second branches are different and are all less than the resistance of the second voltage divider unit, and one of the first branch and the plurality of second branches is connected to the test power supply and the voltage output terminal.

13. The voltage output test circuit according to claim 10, further comprising a feedback unit, wherein the feedback unit is separately connected to the first branch, the second branch, and a voltage output terminal, and is configured to selectively drive, based on a value of a leakage current or a voltage of the output terminal, the first branch or the second branch to connect to the test power supply and the voltage output terminal.

14. The voltage output test circuit according to claim 10, wherein the first voltage divider unit and the fourth voltage divider unit are separately connected to the test power supply through a switch unit, the first branch and the second branch are separately connected to the output terminal through a switch unit, the output test circuit further comprises a logic gate circuit, and the logic gate circuit is configured to provide a control signal of the switch unit.

15. A voltage divider output circuit, comprising at least one voltage output test circuit according to claim 10, wherein the at least one voltage output test circuit is connected to a voltage output terminal through a connection circuit, and one of the at least one voltage output test circuit is connected to the voltage output terminal.

16. The voltage divider output circuit according to claim 15, wherein the connection circuit comprises:
a first connection branch, comprising a first terminal and a second terminal, wherein the first terminal of the first connection branch is connected to an output terminal of the voltage output test circuit, and the second terminal of the first connection branch is connected to the voltage output terminal; and
a second connection branch, which is connected in parallel to the first connection branch, the second connection branch comprising a feedback amplifier, wherein either the first connection branch or the second connection branch is connected to the voltage output test circuit and the voltage output terminal.

17. The voltage output test circuit according to claim 10, wherein the voltage output test circuit is configured to test a memory.

18. The voltage output test circuit according to claim 17, wherein the memory comprises an LPDDR5.

* * * * *